(12) United States Patent  
Knickerbocker et al.

(10) Patent No.: US 8,222,079 B2  
(45) Date of Patent: Jul. 17, 2012

(54) SEMICONDUCTOR DEVICE AND METHOD OF MAKING SEMICONDUCTOR DEVICE

(75) Inventors: John U. Knickerbocker, Monroe, NY (US); Chirag S. Patel, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 11/863,759

(22) Filed: Sep. 28, 2007

(65) Prior Publication Data

US 2009/0085217 A1    Apr. 2, 2009

(51) Int. Cl.
*H01L 21/00* (2006.01)
(52) U.S. Cl. .................. 438/108; 257/E25.006
(58) Field of Classification Search .............. 438/108, 438/613, 614; 257/E23.006
See application file for complete search history.

(56) References Cited

U.S. PATENT DOCUMENTS

| | | | |
|---|---|---|---|
| 6,404,649 B1 * | 6/2002 | Drake et al. ................ | 361/782 |
| 6,614,094 B2 * | 9/2003 | Leonardi et al. ............ | 257/532 |
| 6,884,939 B2 * | 4/2005 | Dishongh et al. ........... | 174/534 |
| 7,005,747 B2 | 2/2006 | Koizumi | |
| 7,622,325 B2 * | 11/2009 | Shim et al. .................. | 438/106 |
| 2002/0117748 A1 * | 8/2002 | Avery et al. ................. | 257/723 |
| 2002/0140085 A1 * | 10/2002 | Lee et al. .................... | 257/724 |
| 2004/0067605 A1 * | 4/2004 | Koizumi ...................... | 438/108 |
| 2004/0140085 A1 | 7/2004 | Dobbs et al. | |

OTHER PUBLICATIONS

United States Office Action dated Dec. 3, 2010 in U.S. Appl. No. 12/544,894.

* cited by examiner

*Primary Examiner* — Jenny L Wagner
(74) *Attorney, Agent, or Firm* — McGinn IP Law Group, PLLC

(57) ABSTRACT

A semiconductor device includes a carrier, a semiconductor chip formed on the carrier, and a micro-chip which is electrically connected to the chip, and includes a thickness which is less than a thickness of the chip.

16 Claims, 10 Drawing Sheets

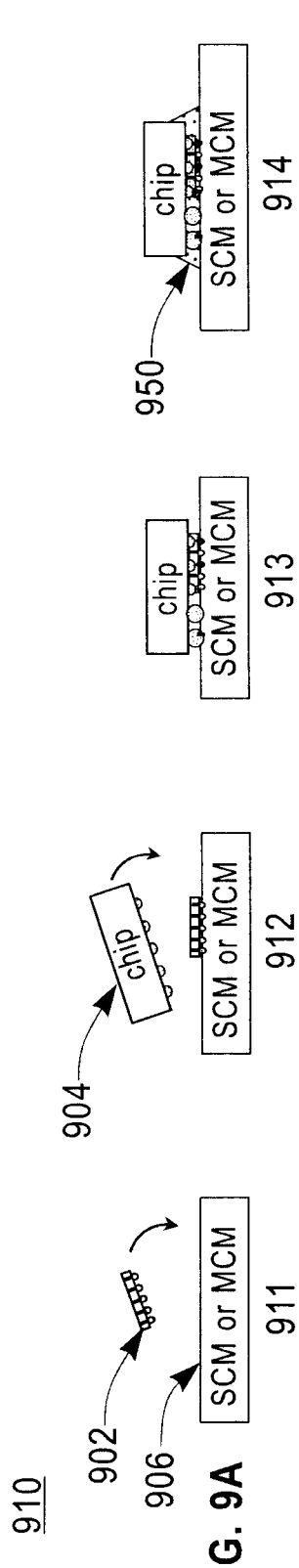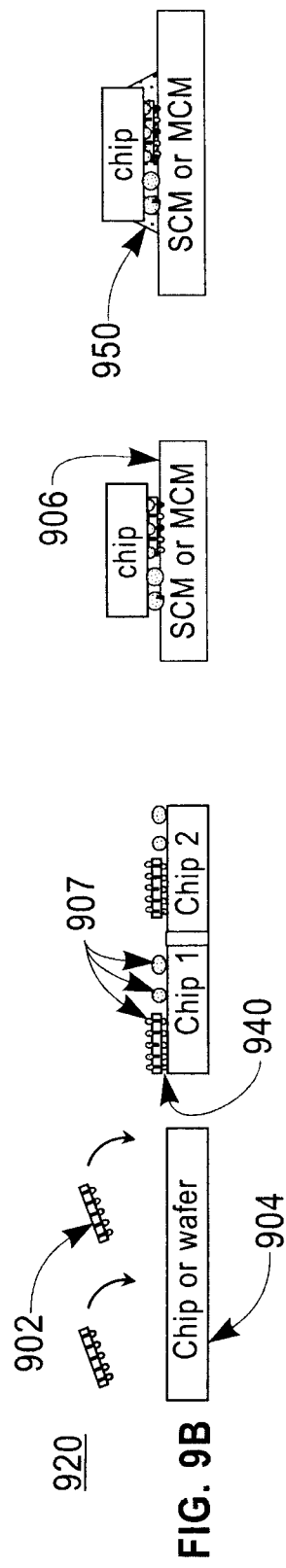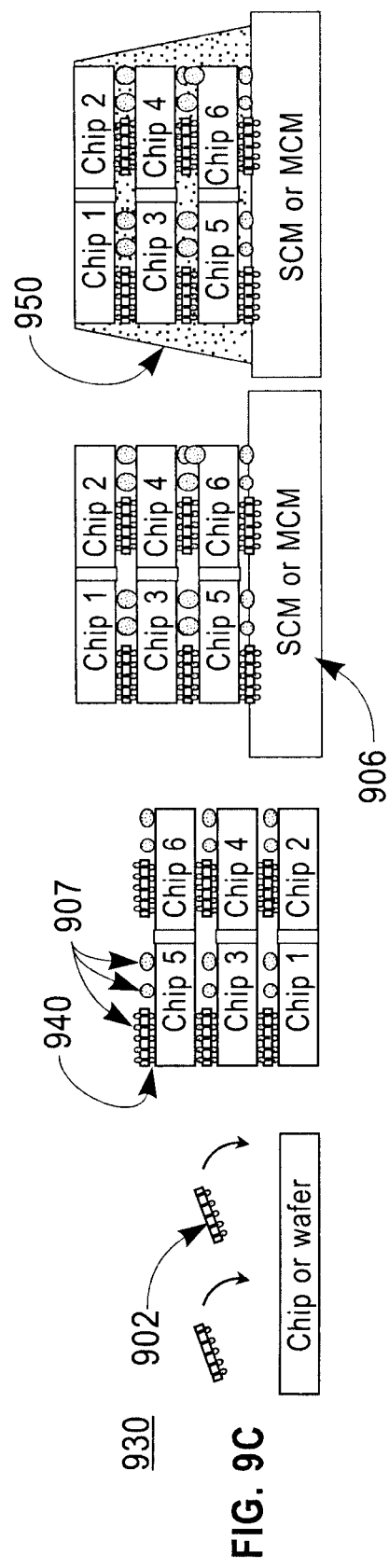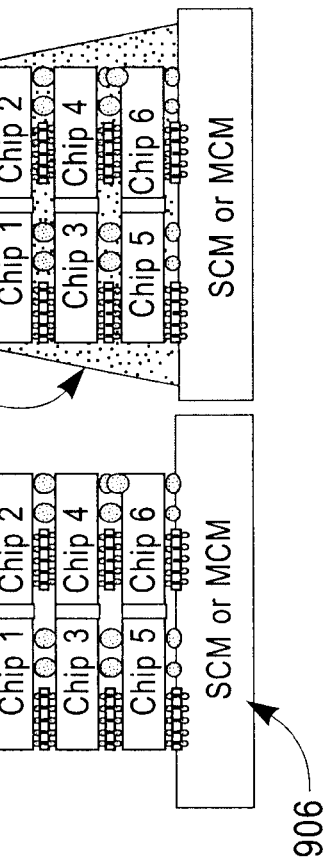
FIG. 9A  FIG. 9B  FIG. 9C

SEMICONDUCTOR DEVICE AND METHOD OF MAKING SEMICONDUCTOR DEVICE

BACKGROUND OF THE INVENTION

1. Field of the Invention

The present invention generally relates to semiconductor devices. In particular, this present invention relates to small, thinned semiconductor device modules and methods for making them.

2. Description of the Related Art

Conventional wafer manufacturing processes include the steps of building of active devices, then placing wiring on top of the active devices. This is called a "front-end-of-line (FEOL)" method of processing a wafer and includes fabrication of active transistors and fine size interconnection wiring and vias which can scale to smaller feature sizes as technology nodes are introduced such as 90 nm, 65 nm, 45 nm, 32 nm sizes as feature size examples. Subsequently, larger wiring and vias are sequentially fabricated which is often called a "back-end-of-line (BEOL)" wiring where total FEOL and BEOL wiring levels can be on the order of 10 wiring levels. Next, the wafers would finish processing and wafer in line testing with interconnection pads or build in self test (BIST) typically using small regions for this wafer BIST. Next wafers can receive solder bumps, followed by full wafer level testing or also functional test to determine known good die, sort die by speed so that known good die can continue to be assembled onto packages after dicing, thus providing various circuit chips in a module that would have a high probability of being functionally good.

Conventional chips may have many different types of circuits incorporated into the same chip. For example, a microprocessor chip may include active logic circuits, active memory circuits such as embedded dynamic random access memory (DRAM), buses between these circuits, drivers and receiver circuits to send or receive signals off chip, and the like. These conventional chips have many different "macros" or devices. A macro may include several different circuits working together to perform a specific function. For example a "macro" may provide function such as logic circuits for computation, circuits for communication off chip while also providing electrostatic discharge protection and circuits which provide clocking function across the chip so the timing for the chip can be managed. A conventional chip may have from a few to 10's of complex macros on the same chip.

The number of process steps for manufacturing these conventional chips is a function of the number and type of circuits and/or macros that are included on the chip. For example, manufacturing of a chip with digital circuits may require a different set of processes than may be required for a chip with radio frequency type circuits. Similarly, the number of process steps increases for manufacturing a chip or wafer with integrated memory circuits in addition to logic circuits compared to a chip or wafer which has only logic circuits or only memory circuits.

The conventional approach to semiconductor chip manufacturing is to include as many of these circuits as possible on the same chip. One conventional design is called a "system-on-a-chip" (e.g., SoC or SOC) which integrates as many functions (i.e. macros) on a chip as is possible within a die size that is believed possible to yield good die from the wafer and still provide value add for the added costs incurred. These chips attempt to integrate all components of a computer or other electronic system into a single integrated circuit (chip). These chips may contain 10 to 40 macros per chip with one or more technology families such as digital, analog, mixed-signal, and/or often radio frequency functions—all on one chip (or a few chips in some cases with integration at the package level for system in package (SIP) solutions). Even when fabricating digital circuitry, added process steps would be needed for integrating two or more different chip technologies such as a processor core and memory onto the same wafer. In one sense, these integrated SOC chips are advantageous because signals between the circuits on the chip do not need to leave the chip and, instead, may only need to traverse between latches on the same chip. Further, the timing for these circuits may be tightly controlled through the use of clocking and phase lock loop type circuits.

However, as the number of circuits increases with each advancing technology node and heterogeneous technology is integrated on a single chip, the manufacturing yield may be substantially reduced due to defects and process variability and due to an increase in process steps for integration, respectively. The greater the number of circuits on a chip and finer size features such as for 45 nm, 32 nm and 22 nm mode, the higher the likelihood that a defect or process limiting variation may be present in one or more of the circuits on that chip and, thus, the overall yield for such chips is reduced. Therefore, even though conventionally hundreds of millions of circuits may be provided on a chip and have been able to achieve relatively high yield with larger feature sizes such as 180 nm, 130 nm and 90 nm with use of wafer fabrication of a specific design such as logic circuitry of memory circuitry. Even chips with high levels of homogeneous circuitry can see declines in manufacturing yield when introducing heterogeneous technology integration for older technology nodes, and even lower yields can be expected for heterogeneous integration and when using smaller technology nodes such as 45 nm and 32 nm nodes.

Additionally, as the number of circuits on a chip is increased, the cost of manufacturing and functional or quality testing for that chip also increases. A chip with a high number of circuits requires a correspondingly larger and/or complex die size. The number of circuits increases cost not only through the increased complexity but also through the increased size of the chip.

Further, as the number of circuits on a chip increases, the number of processes that is required to manufacture such a chip also increases. Thus, the cost of production of such complex chips also increases along with the number of circuits.

The number of process steps that is required to manufacture a chip is a function of the type of devices (or macros) that are being incorporated into the chip. For example, digital circuits require a different set of process steps than the process steps which might be required for radio frequency types of circuits. Similarly, the process steps for memory chips may be different than the steps required for logic chips.

Since conventionally, a system-on-a-chip approach has been taken to incorporate as many different types of devices onto a single chip as is possible, for example, it is conventionally possible to put hundreds of millions of devices upon a single chip, the manufacturing yields for these devices are typically higher when using smaller die sizes (<100 mm$^2$) and limiting the level of heterogeneous integration compared to much larger die sizes (>300 mm$^2$) and integration of multiple heterogeneous technologies.

Conventional chips having several different types of devices often times require hundreds of process steps to incorporate all of the different devices into the chip. For example, a conventional chip may require 300 to 400 process steps to manufacture. Adding an additional type of device to such a chip may require an additional 60 or 70 process steps overall to produce the SOC. If volumes are high, die sizes small and life cycle long, this may be a good option to achieve integration with higher yields coming after high volumes in manufacturing. However, for much shorter product life cycles, larger die sizes and lower volumes, other alternatives such as System in a Package or integration through 3D chip stacking or high bandwidth silicon packages may be applicable.

Further, some devices may include process steps that have a fairly high degree of failure and, despite the fact that the number of devices created by such steps may be very small and may, in fact, only represent a tiny percentage of devices on the chip, these process steps may be responsible for a relatively high percentage of failures, thereby significantly reducing the manufacturing yield.

Further, integration of each of these technologies into a SOC can mean longer design time and costs in order to incorporate each macro into the latest technology node for wafer fabrication even if portions of the chip could have reused prior designs or technology nodes to speed products to market.

SUMMARY OF THE INVENTION

In view of the foregoing and other exemplary problems, drawbacks, and disadvantages of the conventional methods and structures especially for heterogeneous technology integration, large die sizes, high bandwidth mixed technologies, mixed nodes of technology, design reuses and/or for low, mid and some high volume applications, an exemplary feature of the present invention is to provide a method and structure in which integration of these technologies is possible by means of 3D chip stacking, thinned circuit macro integration and use of new 3D chip and high bandwidth semiconductor (e.g., silicon) package integration which has previously not been possible.

A first exemplary aspect of the present invention is directed to a semiconductor device which includes a carrier, a semiconductor chip formed on the carrier, and a micro-chip which is electrically connected to the chip, and includes a thickness which is less than a thickness of the chip.

Another exemplary aspect of the present invention is directed to a method of fabricating a semiconductor device, including forming a micro-chip on one of a carrier and a semiconductor chip, and connecting the semiconductor chip to the carrier, the micro-chip being electrically connected to the chip and including a thickness which is less than a thickness of the chip.

In another exemplary aspect of the present invention, a wafer may minimize process steps to create chip function for specific purpose or multiple functions wherein the functions can be fabricated at wafer level with high yield with primarily like process steps.

An exemplary embodiment of the invention may or may not include thinned silicon or vias through the silicon.

An exemplary embodiment of the invention enables the addition of functionality and/or physically providing additional thinned-mini chip devices or macros or multiple macro-blocks to a chip or to a wafer from another wafer or chip without necessarily incorporating said devices into the chip and/or wafer through conventional SOC build steps all initiated from within one starting wafer.

An exemplary embodiment of the invention provides additional active circuits to the surface of a chip and/or wafer.

An exemplary embodiment of the invention provides an additional active circuit to the build up layers of a chip and/or wafer.

An exemplary embodiment of the invention provides additional active/passive mini-chips which may include, for example, memory, de-coupling capacitors, and the like.

An exemplary embodiment of the present invention provides active and/or passive small, thinned semiconductor devices that may be placed locally and may have through vias that permit connection to the chip and/or wafer and also to a corresponding carrier.

Conventionally, a 200 millimeter wafer is 730 microns thick and a 300 millimeter wafer is about 780 microns thick, but an exemplary small, thinned semiconductor device according to the present invention may be less than about 50 microns thick and preferably, less than 10 microns thick.

An exemplary small, thinned semiconductor device or mini-chip may have vias which permit electrical connections to extend through the device and therefore can be joined using either face to face, face to back or back to back structures. Another exemplary small, thinned semiconductor device may not have through vias. Instead, signals may go "face-to-face" of a thinned component onto the other chip which may have connections around the small, thinned semiconductor device.

An exemplary embodiment of the present invention provides a semiconductor chip package that may be formed from silicon, ceramic, organic and/or composite materials and incorporate the small, thinned semiconductor devices.

An exemplary embodiment of the present invention improves overall manufacturing yield by moving those devices, which may adversely affect the overall manufacturing yield, off of the chip and providing the functionality of those devices in a small, thinned semiconductor device that may be pre-tested to create known good die or mini-chips, then electrically connected to the circuits in the larger chip. In this manner, overall manufacturing yield may be significantly improved.

An exemplary embodiment of the present invention also increases the flexibility in design of devices by improving the ability to customize the functionality of a chip. For example, a chip package may be customized by the addition of select small, thinned semiconductor devices which provide the functionality that is required for a specific application. For example, one may separately manufacture logic elements on a first chip and memory elements on a second wafer. Separating the logic elements onto a wafer that is different from the wafer that includes the memory elements improves the manufacturing yield for both wafers. Subsequently, chips from these wafers may be combined into a package along with the small, thinned semiconductor devices of the present invention. In this manner, the manufacturing yield may be improved and/or optimized. Another example for reference but not limiting the applications to only these two examples, is to separately fabricate logic circuits and clocking or phase lock loop circuitry and then integrate each through this 3D integration methodology.

An exemplary embodiment of the invention provides an active device on a small, thinned semiconductor chip. For example, an exemplary embodiment provides a "silicon on insulator" (SOI) chip which includes active circuits in a silicon layer and an insulator layer that includes an insulating material, such as a buried oxide layer. The insulator layer may act as a very good etch stop layer in wafer thinning. In this manner, the chip may be thinned such as with mechanical grinding and then be etched to the buried oxide layer giving a very precise and repeatable thickness for wafers in manufacturing. An exemplary embodiment of such an active device may have a thickness of <1 micron. Alternatively the oxide layer may be used with a greater depth of surface silicon to permit alternative function such as trench capacitors (for example, 1 to 6 microns of silicon) and in either case, the insulator layer provides one methodology for layer thickness control.

Conventional chips may have many build up levels (e.g., as many as ten sequentially built up process levels). The first process levels typically provide the active devices (e.g., transistors) as well as the smallest wires which provide power and interconnect transistors to create functional integrated circuits. The higher process levels typically include insulators and conductive metal wiring between the active devices for transferring signals and for providing power. As wiring levels are added, vertical connections (called vias) are provided along with x and y wiring. Then, an insulating layer is provided that separates the wiring both laterally and vertically. Conventionally, these higher levels have included only about four or five layers, but now have eight or ten higher levels where the outermost layers are typically referred to as the back-end-of-line (BEOL) and typically comprise the largest size wiring ground rules.

Conventionally, there are two types of electrical interconnection or wiring leaving a chip. Either a solder connection that connects contact pads at the bottom of a chip using solder to a package (which provides fan-out wiring, fan in or some combination of wiring redistribution) often referred to as flip chip technology, or pads on the surface which support wire bonding to the pads.

An exemplary embodiment of the invention provides small, thinned semiconductor active circuits, such as, for example de-coupling capacitors. These devices may be positioned within a chip or package only where decoupling capacitor circuits are needed in a 3D integrated solution compared to an interposer approach which may have higher capacitance but also cost more even if the added capacitance is not needed across the entire device or chip. These critical active circuits can be small in the x and y dimensions, which provides the ability to provide many of these additional active devices to a chip wafer. Further, a manufacturer is able to pick and choose to apply only the good active or passive devices and avoid providing faulty active devices which would otherwise reduce the yield.

An exemplary embodiment of the present invention enables the testing of active devices on the small, thinned semiconductor devices before connecting them to another chip wafer. In this manner, the problem of providing faulty devices is avoided and assembly yields are developed which can be support integration of said thinned semiconductor devices. For example, a wafer may have over one hundred dies on it and the die may be 16 mm on a side. Conventionally, if another circuit is desired, the chip size must be increased in both thickness and width. For example, adding another device may require increasing the size of the chip wafer to 20×20 mm.

An exemplary embodiment of the invention provides small, thinned semiconductor devices that may actually be incorporated directly into or onto a semiconductor chip, during or after the processing of the other layers.

In one exemplary embodiment, a small, thinned semiconductor device may include through vias that enable a connection from a larger chip wafer on one side of the small, thinned semiconductor device to a circuit package on the other side of the small, thinned semiconductor device. These through vias may, therefore, maintain power distribution and signals through the package to the active device.

An exemplary embodiment of small, thinned semiconductor devices may include a trenched de-coupling capacitor, parallel plate capacitor or integrated capacitor with trench and parallel plate capacitance. For example, conventional chip wafers may include multiple logic core processors. Each of these cores tend to include active circuits that draw a lot of power. Providing a de-coupling capacitor beneath each of the cores on a chip can provide reduced noise by having close proximity low inductance capacitors, reduced power through operation at lower voltages and/or increased circuit limited yield for these devices.

A conventional multiple core processor may be 16×16 millimeters on a side, while an exemplary small, thinned semiconductor device in accordance with an exemplary aspect of the present invention may only be 2×2 mm on a side. Conventionally, adding integrated decoupling capacitors on chip may require not only processing steps to fabricate the wafer but may add additional X-Y size to the chip depending upon the level of integrated capacitance sought for the chip. Each can add cost to the die.

In stark contrast, an exemplary embodiment of the invention provides small, thinned semiconductor devices having decoupling capacitors under each of the chip cores, higher power consumption macros or "hot spots" on a chip. Thus a simple cost of the mini-chips compared to a full interposer can be related to the relative area of these mini-chips plus assembly or integration cost, respectively. Such an integration can lead to substantial product cost savings for many applications. As explained above, these small, thinned semiconductor devices may greatly reduce a silicon area amount (e.g., where the a micro-chip which is 2 mm on a side, even an 8 core chip would only have a 32 mm$^2$ silicon area compared to a 16 mm on a side interposer decoupling capacitor which would be 256 mm$^2$).

Thus, for example, an area covered by a full size chip interposer used for a decoupling capacitor is about 256 square millimeters compared to 8 smaller die each of 2×2 mm size or 32 square millimeters or a factor of 8 times smaller Si area per die and approximately 8 times lower cost. An exemplary embodiment of the present invention may provide small, thinned semiconductor devices only where necessary. This reduction in area may provide additional performance enhancement, power reduction, chip sorts and/or speed sorts that permit the chips to run faster, while simultaneously improving chip manufacturing yield. In this manner, an exemplary embodiment of the present invention may provide a five to ten percent performance improvement.

The relative cost of adding another silicon layer for decoupling capacitors which covers the entire layer may be X dollars, while the present invention may be X over 8 or approximately 12% the cost of the full silicon decoupling capacitor layer in this example. Relative cost is both a function of the area of the silicon used as well as the relative cost of the assembly which in the above example is nearly the same for either one silicon interposer of larger size or use of 8 silicon interposer chiplets. In each case, the product performance is enhanced by reducing simultaneous switching noise on the active circuit chip.

Another exemplary embodiment of the present invention may provide a small, thinned semiconductor device having memory and may apply that device to the surface of a chip wafer to increase the cache or memory that is available to the active circuits on the chip.

Further, in an exemplary embodiment, these small, thinned semiconductor devices may be positioned directly underneath active devices in a chip wafer to reduce the signal line length between the on-chip devices and the cache or memory cells. In this manner, the cache or memory latency is reduced and the chip performance is enhanced.

Several of inventive small, thinned semiconductor devices may be applied to the same chip wafer for the same and/or different functionality.

Another exemplary embodiment of the present invention may provide a small, thinned semiconductor device with a radio frequency circuit that may be applied to and positioned on a logic circuit such that any affect of noise upon the logic circuits from the radio frequency circuit is minimized.

An exemplary embodiment may include stacked sets of mini-chips between a chip wafer and a package substrate.

An exemplary embodiment of the present invention may apply a small, thinned semiconductor device to a package substrate rather than to a chip wafer or both.

An exemplary embodiment may include a small, thinned semiconductor device provided to a carrier. For example, clocking may be provided to a silicon carrier. Thus, small, thinned semiconductor devices that incorporate clock signal repeaters may be attached to the silicon carrier. These small, thinned semiconductor devices may only be provided where needed upon the silicon carrier to reduce cost.

An exemplary embodiment of the present invention includes small, thinned semiconductor devices that are less than about 50 microns thick and preferably less than 20 microns and even more preferably less than 1 to 10 microns thick. This is in stark contrast to conventional structures which are about 730 microns or 780 microns thickness.

An exemplary embodiment of the present invention includes small, thinned semiconductor devices with vertical through connections. An advantage of having a vertical through connection increases as the area of the small, thinned semiconductor device increases.

An exemplary embodiment of the invention manufactures small, thinned semiconductor devices by providing a wafer with active circuits, and thinning the device by grinding and polishing, and/or etching down to an etch stop layer or desired silicon thickness. The resulting small, thinned semiconductor device is less than 50 microns thick and can be less than 1 to 10 um in thickness.

An exemplary embodiment of the present invention bonds a small, thinned semiconductor device to a chip wafer using an ultrasonic bonding method. The ultrasonic bonding method provides an increased pressure and temperature along with a vibration to bond the small, thinned semiconductor device to the chip wafer.

Another exemplary embodiment of the present invention bonds a small, thinned semiconductor device to a wafer using a copper-tin method. After bonding, the wafer may continue to be processed normally, such as with a polyimide coating, which is several microns thick. Such a coating would easily cover the small, thinned semiconductor device. Next, openings may be provided through the coating, vias may be added and solder connections may then be made to the vias. In this manner, the vias may be the same height across the entire wafer even with the mini-chip.

Examples of passive device configurations include use of capacitors, resistors and/or inductors into the 3D structure. Advantages of each of these passive circuits in the system can be as simple as for miniaturization for portable electronics and simplification and cost reduction, reliability enhancement of assembled system by using one or a few of these integrated mini-chips compared to large quantities of discrete components. In addition, due to shorter wire lengths, reduced resistance wiring and lower capacitance wires as well as the ability to provide low inductance path for the passive components permit the ability to have the active circuits operate at lower power levels and or with lower cross talk noise. Note as an example of passive capacitive circuits, trench decoupling capacitors, parallel plate capacitors or combined trench and parallel plate capacitors can be used. Normally the parallel plate capacitors can provide smaller total capacitance but can have higher frequency response due to lower inductance. The trench capacitors can have high relative capacitance per unit area compared to parallel plate capacitors.

Examples of active circuits can be use of voltage regulators in an interposer or also with decoupling capacitors to provide fine control for consistent voltage delivery to a chip as well as to be able to power on or off local circuits on a chip and in this way reduce total power consumption of a chip while not needed for some period of time. An example would be for a chip with 8 integrated processor cores to be able to power down one or more of these cores when not required for system computation. The advantage in this example included not only the ability to provide stable power to a chip, but can provide segmented voltages which could correspond to reduced power consumption for portions of the chip where lower voltage is acceptable but could also have power savings in the ability to power down one or more cores again saving power when a respective core is not needed for computation. Similarly, increased cache can be provided near to processor core chips especially where multi-core processors are desired. Note that increased high bandwidth with low latency cache or memory to cores are needed as the number of cores are increased in order to obtain increased performance in computing solutions. The reason that increased cores provide improvement in performance relates to limitations in frequency scaling on a processor relative to power consumption or efficiency. Other examples of heterogeneous integration include use of wireless circuits and digital circuits for performance, power savings, miniaturization and cost reduction. These elements once again can be realized due to close proximity of circuits, reduced wire lengths and reduced time for transmission from one circuit to another as 3D integration and finer nodes of integrated microelectronic circuit chips are introduced.

Another class of integration could include integration for optics and electronic circuits which opens to opportunity for a 3D stack to have increased density and bandwidth for signals or communication within a system.

Yet another class of integration solutions may take advantage of not only 3D electronics but also sensors, accelerometers, bio-sensors, actuators and the like. Here, the same benefits for miniaturization, shorter wire lengths, reduced power consumption and lower cost are possible for the reasons stated above.

These and many other advantages may be achieved with the present invention.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIGS. 9A-9C illustrate three exemplary methods of assembly and fabrication of micro-chips on a package (method 910), on a chip (method 920) or into a chip stack (method 930).

DETAILED DESCRIPTION OF EXEMPLARY EMBODIMENTS OF THE INVENTION

Figure 1A:
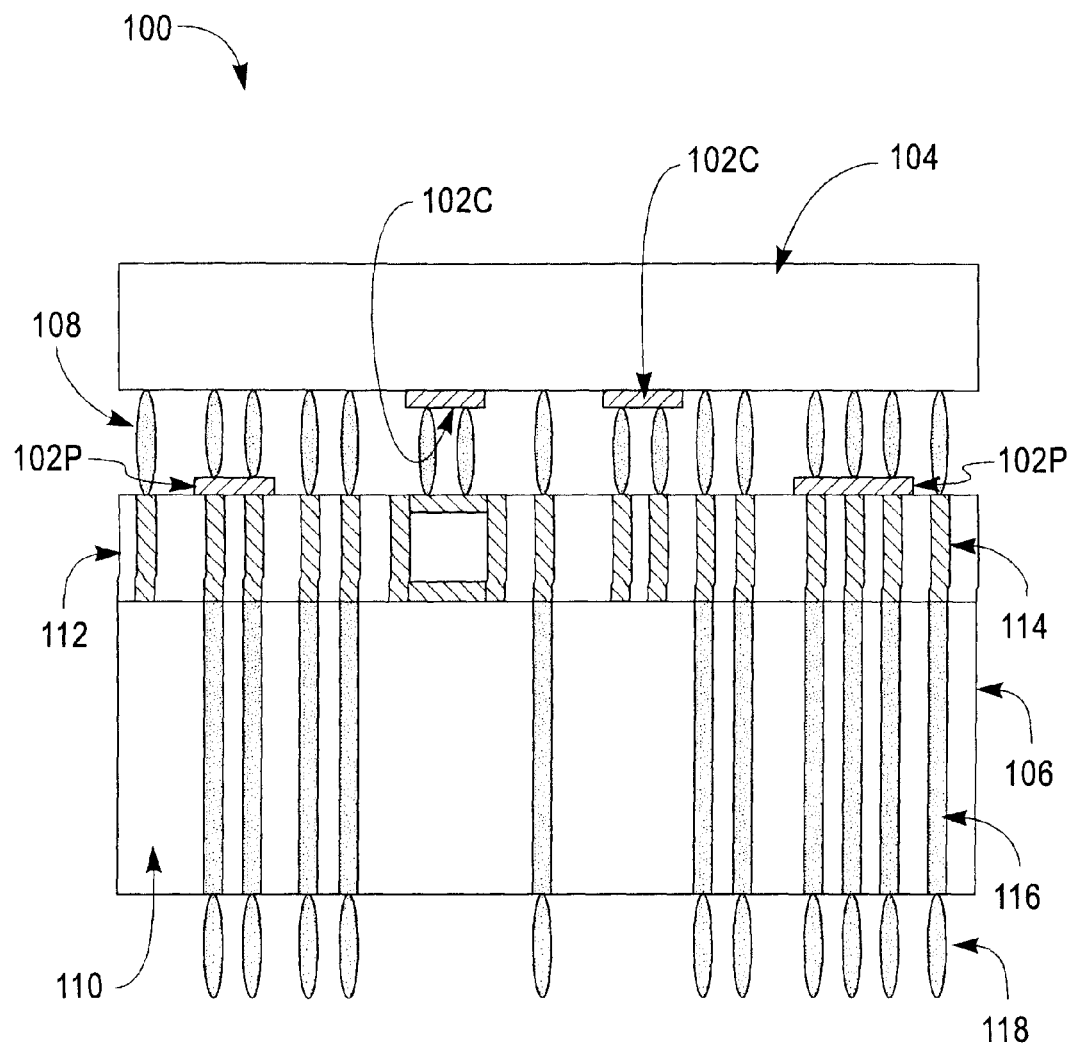
FIG. 1A illustrates a cross-sectional view of an exemplary chip on package also called a module for system application (e.g., device 100) for the small, thinned semiconductor devices (102) which can be assembled or integrated in or onto chip (102C), in or on the package (102P) or both. in accordance with this first illustration (e.g., device 100). The resulting structure may be referred to as a 3D+ integrated solution, chip+mini chip(s)+package=module for system application.

Referring now to the drawings, and more particularly to FIGS. 1-9C there are shown exemplary embodiments of the method and structures of the present invention.

FIG. 1A illustrates a cross-sectional view of an exemplary application 100 for the small, thinned semiconductor devices also called micro-chips or micro-die 102 in accordance with the present invention either mounted to the package (e.g., carrier) as 102P or to a chip as 102C.

As illustrated in FIG. 1A, an exemplary aspect of the present invention is directed to a semiconductor device 100 which includes a carrier 106, a semiconductor chip 104 formed on the carrier 106, and a micro-chip 102P/102C which is electrically connected to the chip 104, and includes a thickness which is less than a thickness of the chip 104.

Figure 1B:
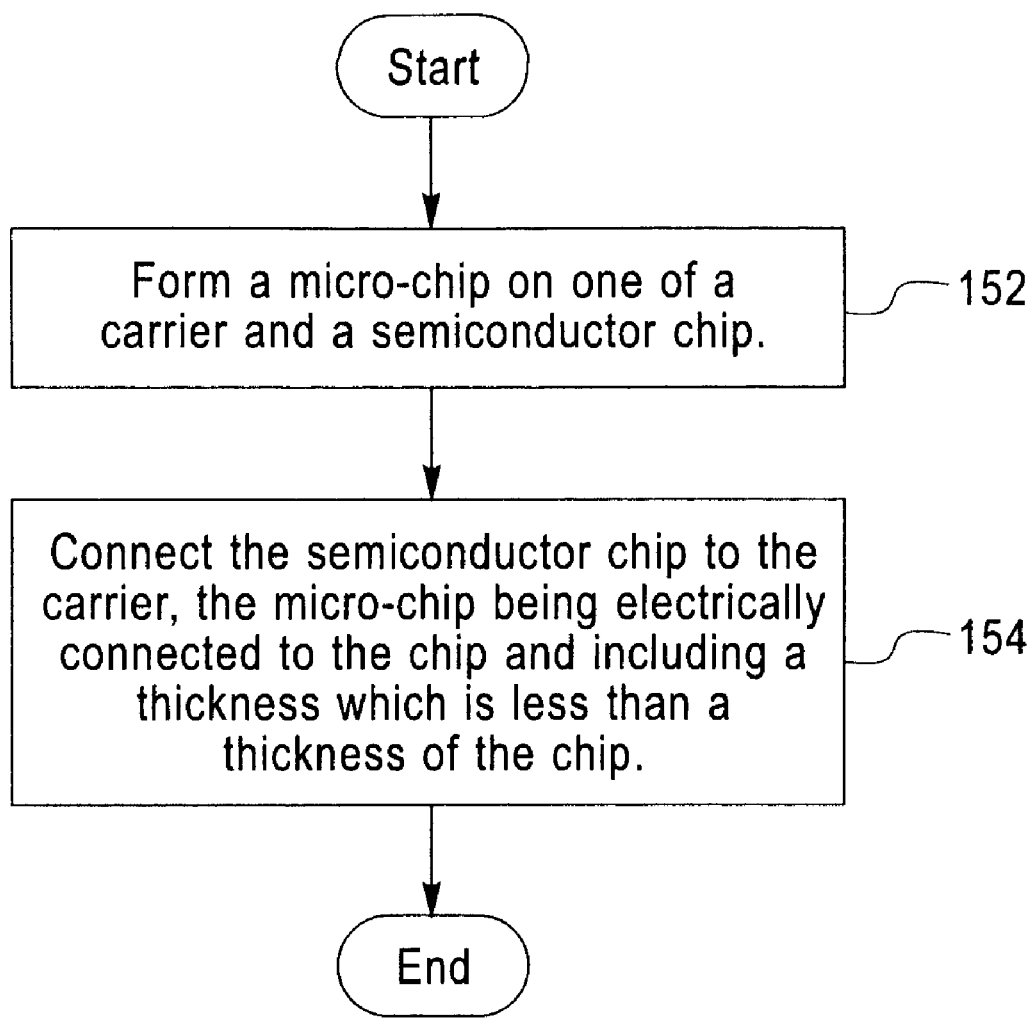
FIG. 1B illustrates a method 150 of a method of fabricating a semiconductor device according to an exemplary aspect of the present invention.

FIG. 1B illustrates a method 150 of a method of fabricating a semiconductor device according to an exemplary aspect of the present invention. The method 150 includes forming (152) a micro-chip on one of a carrier and a semiconductor chip, and connecting (154) the semiconductor chip to the carrier, the micro-chip being electrically connected to the chip and including a thickness which is less than a thickness of the chip.

More particularly, FIG. 1A illustrates an exemplary semiconductor device 100 which includes a semiconductor chip 104, a carrier 106, interconnects 108, and interconnects 118. The interconnects 108 electrically connect and bond the semiconductor chip 104 to the carrier 106. The carrier 106 includes a semiconductor (e.g., silicon) substrate 110 and an insulation layer 112. The insulation layer 112 includes vias 114 and the silicon substrate 110 includes vias 116, which may each include a conductor and an insulating liner (not shown). The carrier 106 may also optionally include a barrier layer (not shown).

The small, thinned semiconductor devices 102 are positioned at various locations as required. For example, as shown in FIG. 1, the small, thinned semiconductor devices 102 are positioned between the interconnects 108 and the insulation layer 112 and between the interconnects 108 and the semiconductor chip 104. In this manner, the small, thinned semiconductor devices or micro-chips 102 provide additional functionality, flexibility, and versatility to the exemplary device 100 while obviating the need to incorporate that functionality into either the semiconductor chip 104 or the carrier 106.

Figure 2:
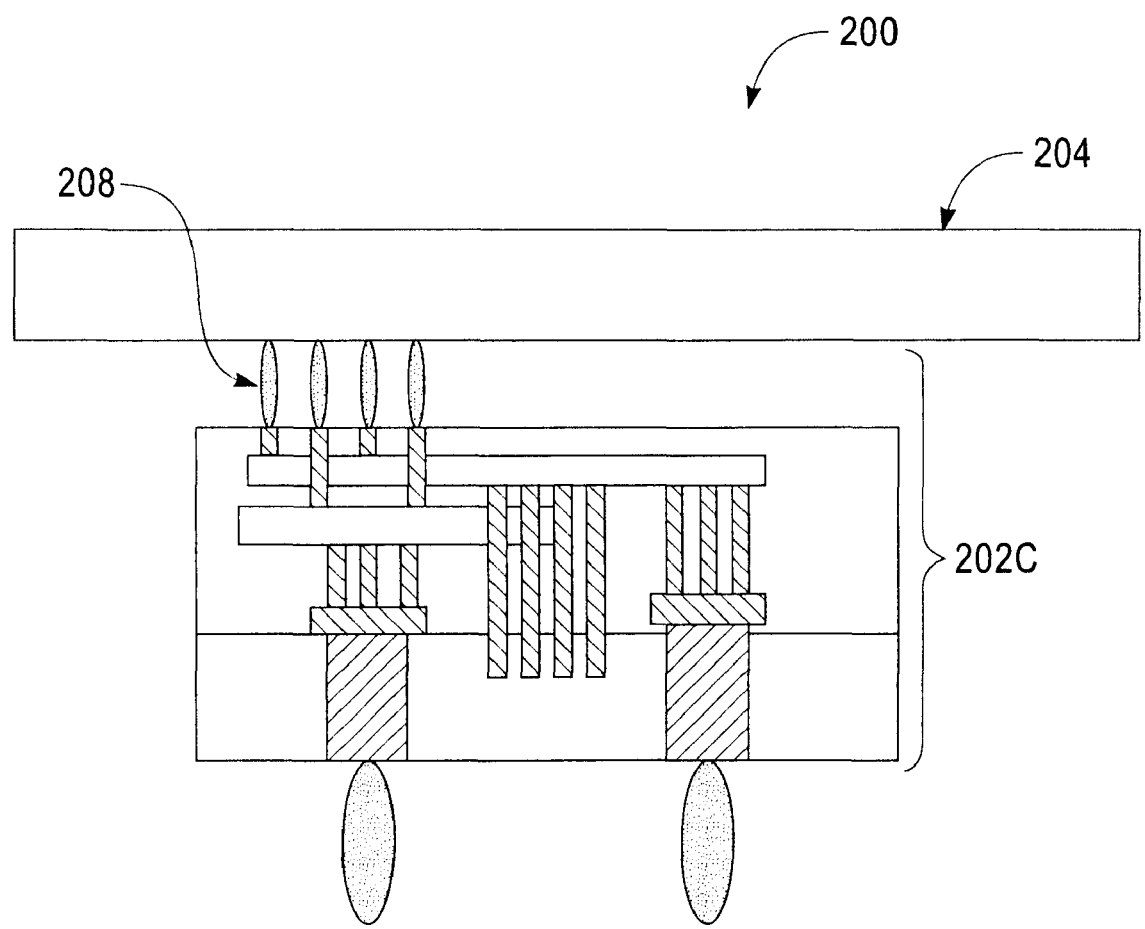
FIG. 2 illustrates (e.g., by example, which should not be considered as a limitation of the design, structure or process of the invention) a cross-sectional expanded view which shows the thinned silicon capacitor having through silicon vias, trench decoupling capacitors, power and ground wiring grids and interconnection to a small portion of the chip is made in this schematic illustration. For purposes of interconnection to the chip and or package, an array of miniature solder connections can be made to join the decoupling capacitor to the active circuit chip and or package. Alternatively, copper to copper bonding, oxide or adhesive bonding may also be used.

FIG. 2 illustrates a cross-sectional view of an exemplary small, thinned decoupling capacitor 200 in accordance with the present invention. The capacitor 200 may include a micro-chip 202C connected by interconnects 208 to a semiconductor chip 204. Micro-chip 202C is further illustrated in the expanded view in FIG. 8 which illustrates the through silicon vias (TSV), trench capacitors, build up vias and wiring and associated contact pads and dielectric (e.g., interlevel dielectric (ILD) such as oxide or nitride).

Figure 3:
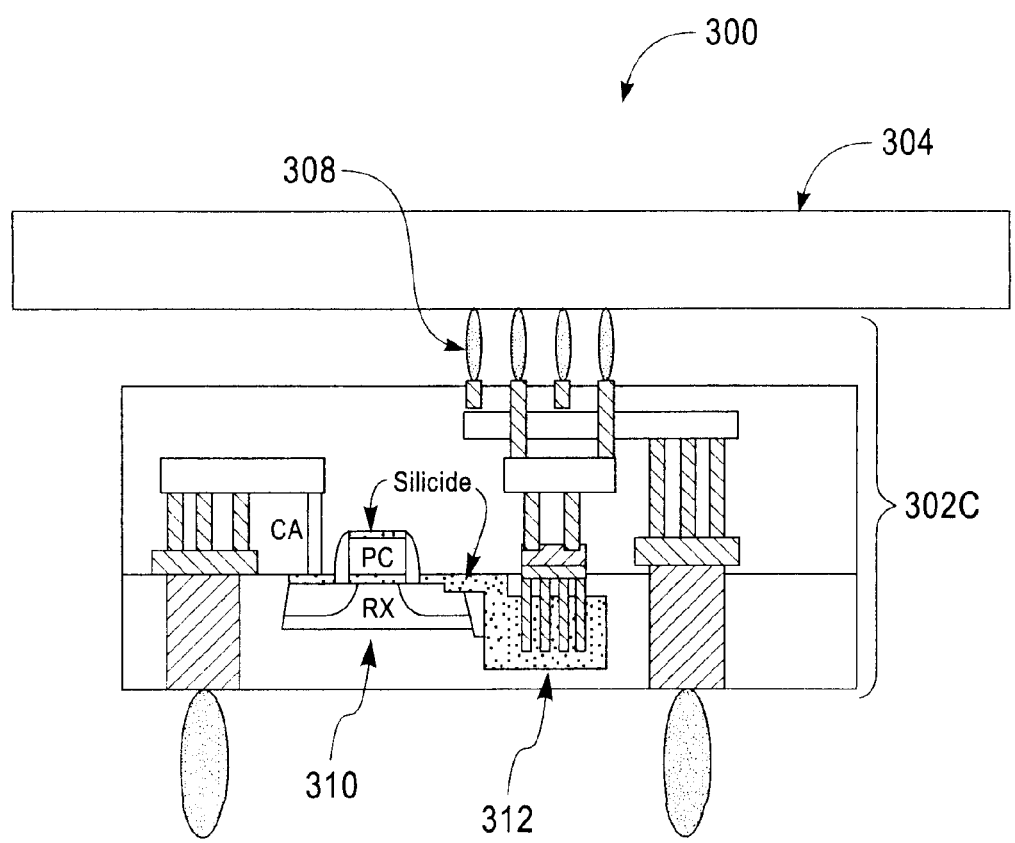
FIG. 3 illustrates a representation of a cross-sectional view of an exemplary small, integrated, thinned active semiconductor circuit plus decoupling capacitors 300 in accordance with the present invention where the active circuitry can represent voltage regulation or switch circuitry.

FIG. 3 illustrates a cross-sectional view of an exemplary small, thinned active semiconductor circuit 300 in accordance with the present invention. The capacitor 300 may include a micro-chip 302C connected by interconnects 308 to a semiconductor chip 304. FIG. 3 further illustrates both active device schematic (e.g., transistor 310) and trench capacitor 312.

Figure 4:
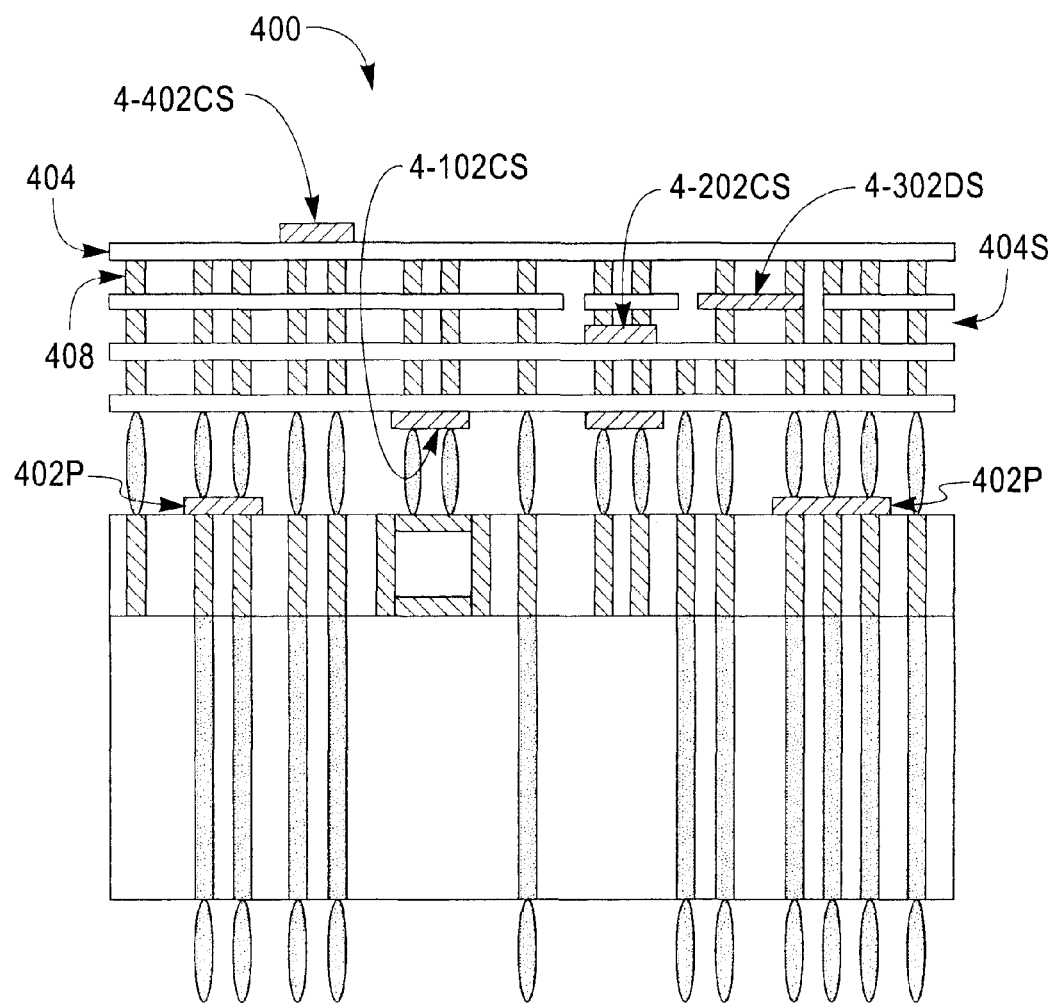
FIG. 4 illustrates a cross-sectional view of another exemplary application 400 using a chip stack plus integrated mini-chips including those such as attached to chip 1 in the chip stack (4-102CS) attached to chip two in the stack (4-202CS), within a cavity or between chips as a discrete mini-chip in the chip stack at layer 3 (4-302DS) and so forth for the small, thinned semiconductor devices in accordance with the present invention when used in a chip stack or chip stack with package called a module which again can be applied for system applications.

FIG. 4 illustrates a cross-sectional view of another exemplary application for the small, thinned semiconductor devices in accordance with the present invention. As illustrated in FIG. 4, a module 400 (e.g., 3D chip stack) may include micro-chip devices (e.g., 402P, 4-102CS, 4-202CS, 4-302DS, 4-402CS) attached at different levels. For example, a micro-chip device (e.g., 4-102CS) may be attached to an individual chip, a micro-chip device (e.g., 4-302DS) may be formed in a cavity or between two chips, and so on. A difference between the exemplary device 100 of FIG. 1 and the module 400, is that the semiconductor chip 104 of FIG. 1 may be replaced with a chip stack 404S. The chip stack 404S may include a plurality of silicon-based layers 404 stacked on top of each other with vias 408 electrically connecting the layers 404. The small, thinned semiconductor devices may be positioned between layers 404, in place of a layer 404, embedded in a layer 404, or positioned on top of the stack 404S. That is, the small, thinned semiconductor devices may be positioned and/or incorporated anywhere within or on the chip stack 404S.

Figure 7:
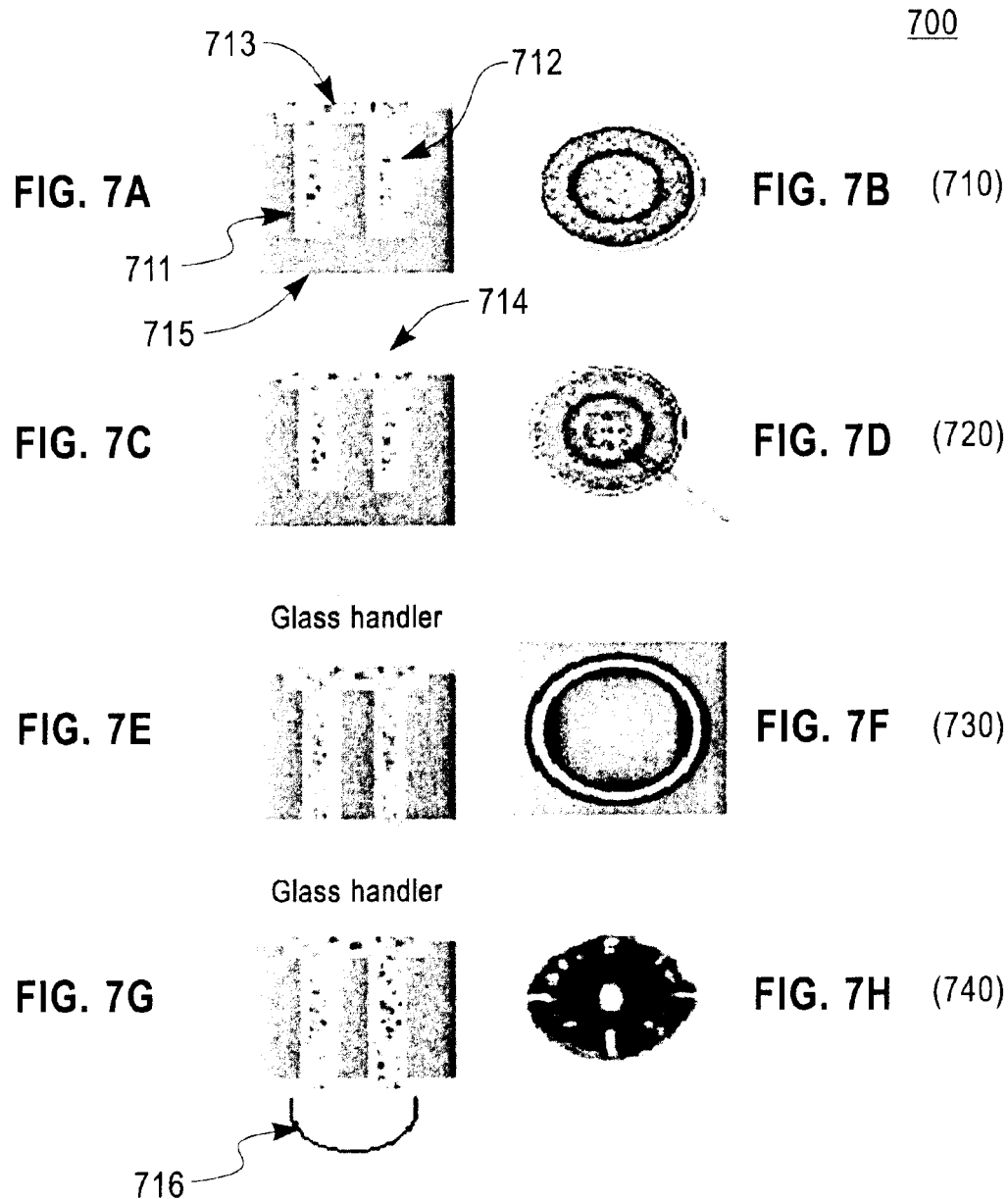
FIGS. 7A-7H provide a flowchart and illustrate examples of fabricating through-silicon-vias in the small samples by means of deep reactive ion etch, dielectric isolation, liner/adhesive deposition, conductor deposition, and later silicon thinning to make contacts to the back side of the wafer or die. In addition, pads can be deposited and solder deposited for interconnection to the backside of the chip or package. Passive or active circuits along with wiring and top surface contacts and pads can be fabricated using existing processes. Depending on thickness of the thinned silicon, a mechanical handler can be used to hold the wafer during process and transfer in fabricating the 3D structures. These small components can then be joined to a die or package using solder interconnection pads and solder followed by underfill for mechanical and reliability and thermal enhancements. The chips or packages can be pre-tested at wafer level to verify known good die or components and can again be tested once assembled into the module. Alternatively, the chips, die stacks and packages can be joined by means of a copper to copper bonding, oxide bonding or adhesive joining. The resulting structures, methods, processes and test processes for making and assembling the small, thinned semiconductor devices or packages are in accordance with the present invention.
Figure 8:
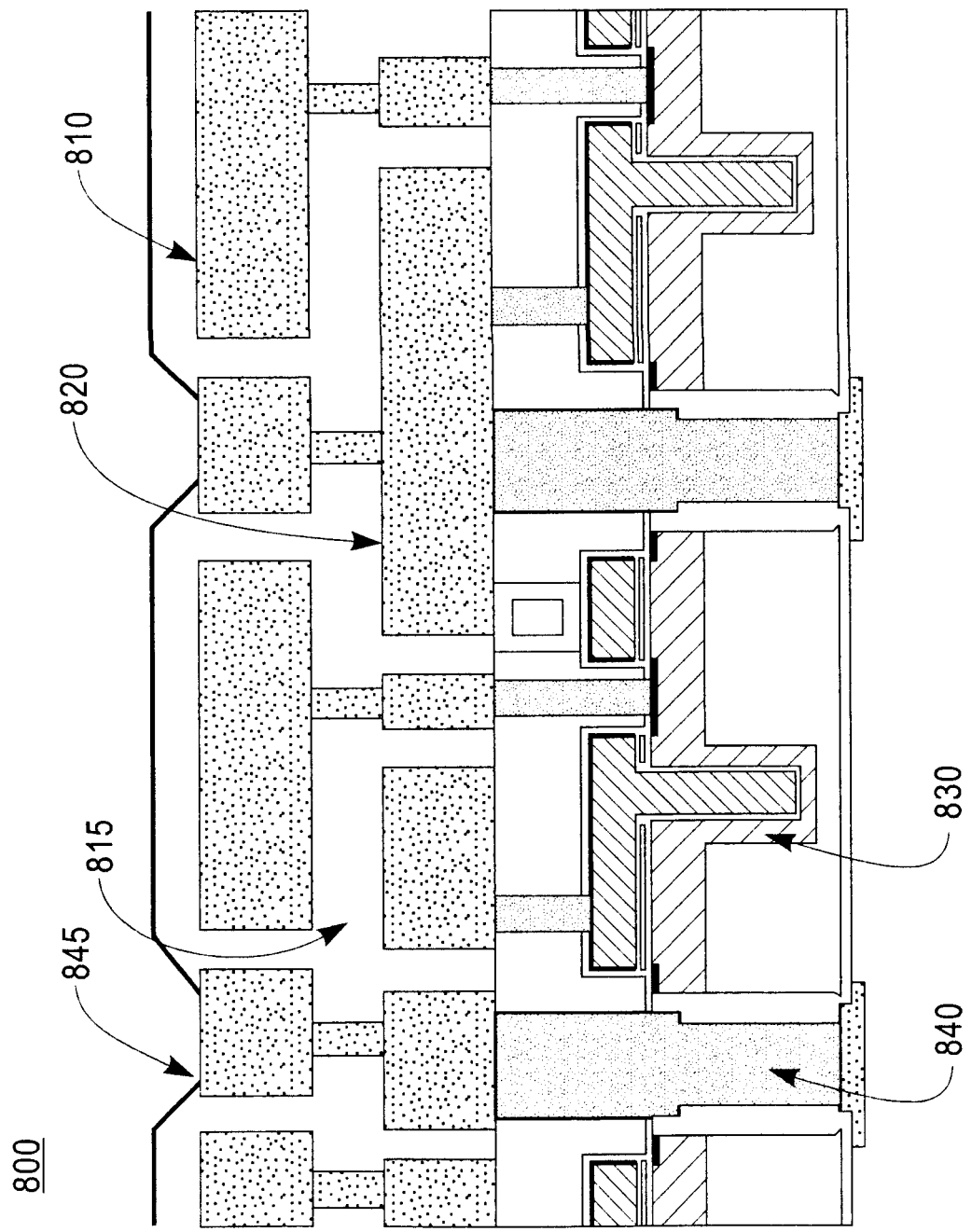
FIG. 8 illustrates through silicon vias (TSVs) along with example of trench capacitors, back side pads to contact to TSV, electrical isolation from Si in TSV and backside pads using oxide or nitride, traditional use of wiring and vias for voltage and ground distribution in the silicon. Alternatively active circuits or combinations of active circuits, wiring and passive components could be built with the wafers and then thinned and pads added to the backside of the TSVs.

Examples of process flows for build and assembly of a micro-chip device according to an exemplary aspect of the present invention (e.g., 102C, 102P, 202C, etc.) are illustrated in detail in FIGS. 7, 8 and 9.

Figure 5:
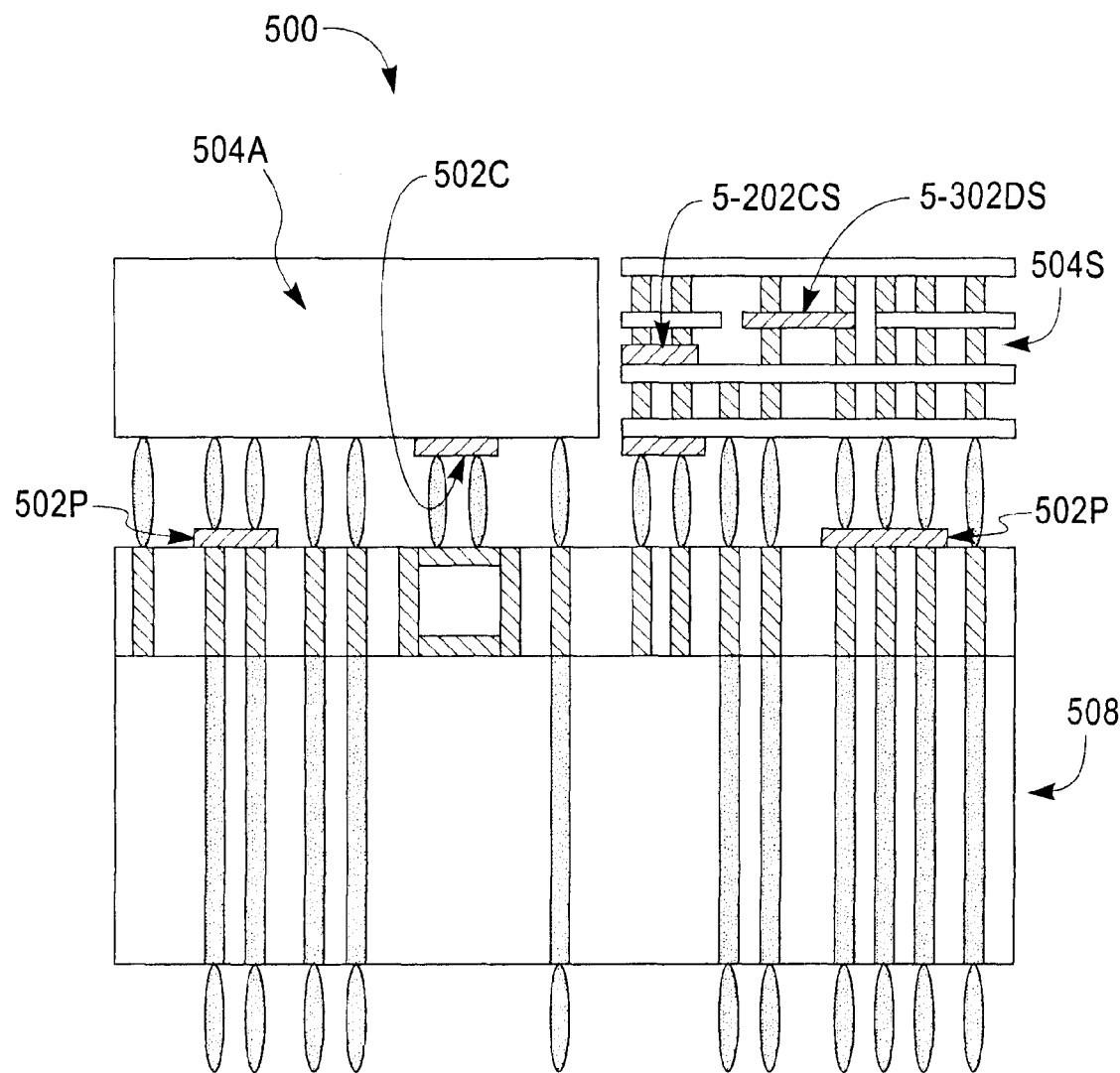
FIG. 5 illustrates a cross-sectional view of yet another exemplary application 500 using a multi-chip package where two or more chips, chip stacks are placed on a package using for the small, thinned semiconductor devices in accordance with the present invention and again having the option for inclusion of these small thinned mini-chips incorporated onto the package (502P), included on a discrete chip (502C) or on or within the chip stack ((5-102CS), 5-202CS), 5-302DS), etc)

FIG. 5 illustrates a cross-sectional view of yet another exemplary application for the small, thinned semiconductor devices in accordance with the present invention. The multi-chip module (MCM) 500 illustrated in FIG. 5 may include a chip 504A and a chip stack 504S on the package (e.g., carrier 508). The small, thinned semiconductor devices (e.g., 502P, 502C, 5-202CS, 5-302DS) may be mounted on the carrier 508, on the semiconductor chip 504A, and on and within the chip stack 504S.

Figure 6:
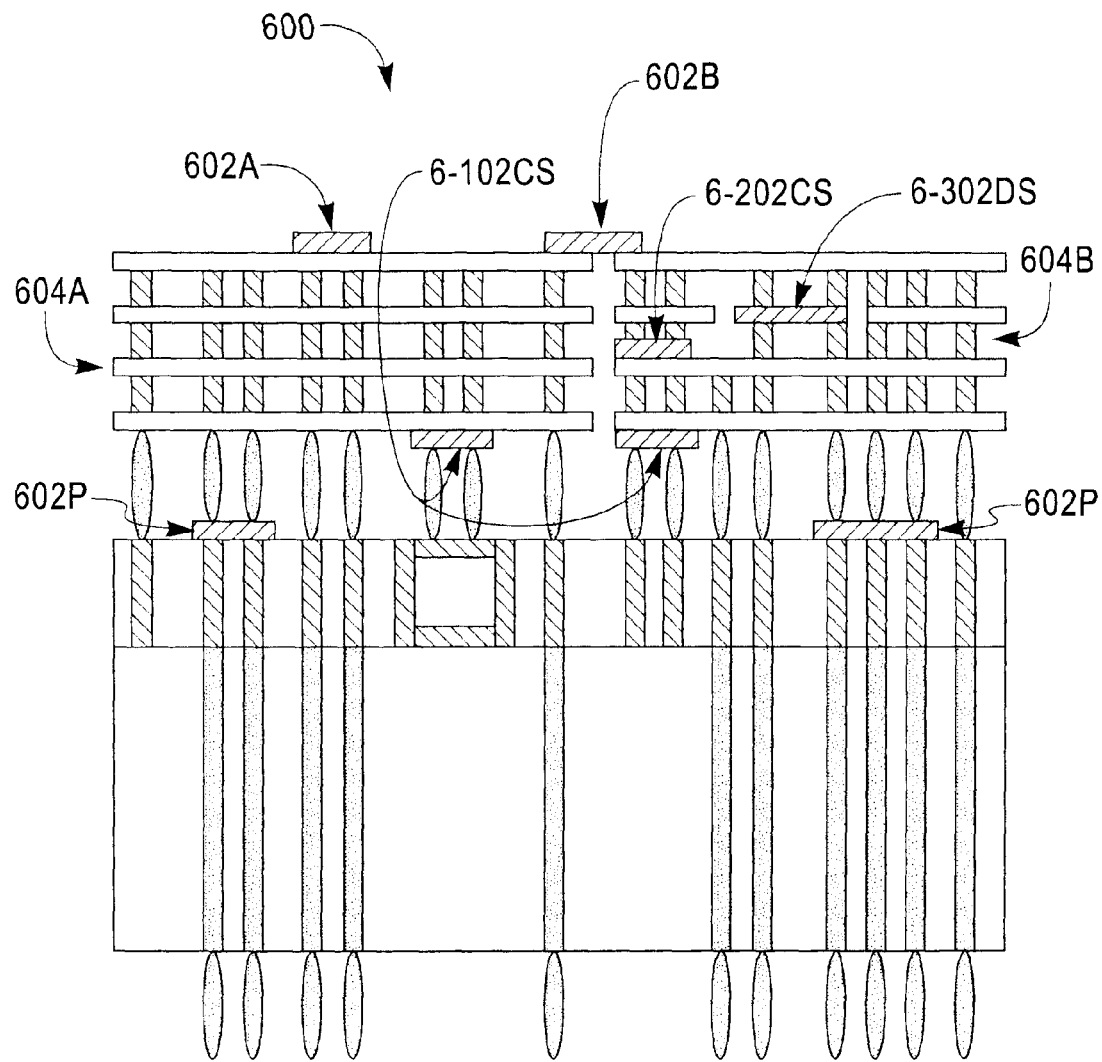
FIG. 6 illustrates a cross-sectional view of another exemplary application 600 for the integration of small, thinned semiconductor devices integrated with either a small electronic sensor, bio-sensor or other sensor or actuator (602 Sensor) and/or a small integrated silicon device, passive circuit or sensor or micro-electro-mechanical system (MEMS) device (602 Jumper) which can use wiring to supplement the package wiring for chip to chip stack or between chips or chip stacks or jump between two or more chips or chip stacks with function desired by each such as shared memory, capacitance, provide dual direction power delivery (top and bottom) or other added function to the integrated module. The bridge or jumper chip may provide added interconnection wiring, power distribution and is in accordance with the present invention.

FIG. 6 illustrates a cross-sectional view of another exemplary application for the small, thinned semiconductor devices (e.g., 602P, 6-102CS, 6-202CS, 6-302DS in accordance with the present invention where integration is made using heterogeneous function such as a sensor chip 602A, an actuator chip or a jumper chip 602B for new applications. The exemplary device 600 may be similar to the application (e.g., module 400) that is described above with reference to FIG. 4. However, the exemplary device 600 includes two chip stacks 604A, 604B that are connected by a small, thinned semiconductor device (e.g., jumper chip 602B).

Those of ordinary skill in the art understand that the two chip stacks 604A, 604B may be replaced with one or more semiconductor chips and/or chip stacks and still form a part of the present invention.

The small, thinned semiconductor device of the present invention may also take advantage of silicon on insulator ("SOI") technology. That is, a micro-chip device (e.g., 102P) may be attached to an SOI wafer as a carrier (e.g., carrier 106).

Further, the small, thinned semiconductor device (e.g., 102P) may be joined to a surface (e.g., a surface of carrier 106) using precision placement and joining methods. Attachment of the device to the surface may be made with copper bonder, solder bonder, or alternate bonding and solder. Alternate bonding may be especially useful, for example, for chip to carrier and/or die stack devices.

FIGS. 7A-7H illustrates an exemplary method 700 of fabricating through silicon vias (TSV) which can then be incorporated with wiring, decoupling capacitors or other passive function and/or with active circuits. In particular, FIGS. 7A, 7C, 7E and 7G illustrate a cross-sectional view of a wafer 715, and FIGS. 7B, 7D, 7F and 7H illustrates an axial view of a via in the wafer 715.

As illustrated in FIGS. 7A-7B, the method 700 may include a first processing (710) including forming a via 711 in a wafer 715 using a deep semiconductor (e.g., silicon) reactive ion etch (RIE), forming an insulating layer 712 in the via, and filling the via with a metal fill 713. As illustrated in FIGS. 7C-7D, the method 700 may include a second processing (720) which includes forming a wiring level 714.

As illustrated in FIGS. 7E-7F, the method 700 may include a third processing (730) which includes mounting the wafer 715 to a mechanical carrier (e.g., glass handler) and thinning the wafer 715 to expose the vias 711. As illustrated in FIGS. 7G-7H, the method 700 may also include a fourth processing (740) which includes processing the backside of the wafer 715 to add ball-limiting metallurgies (BLM) and/or microbumps 716 (C4).

FIG. 8 illustrates an example schematic showing both the TSV, trench capacitors and wiring levels added to the thinned silicon microchip. More particularly, FIG. 8 illustrates a micro-chip device 800 that includes two wiring levels (e.g., GND plane 810 and segmented VDD planes 820) separated by an interlevel dielectric (ILD) 815, a trench decoupling capacitor 830 and a through silicon via (TSV) 840. The TSV 840 may have an end 845 that may be connected to a pad or a via. For example, the wiring levels may include copper wiring levels (e.g., 1.2 μm thick copper wiring layers) and the interlevel dielectric may include at least one of an oxide and a nitride.

FIGS. 9A-9B illustrate three exemplary methods of assembly and fabrication of micro-chips on a package (method 910), on a chip (method 920) or into a chip stack (method 930).

For example, as illustrated in FIG. 9A, the exemplary method 910 may include placing (911) the micro-chip 902 on a package 906 (e.g., a single chip module (SCM) or multiple chip module (MCM)), placing (912) a chip 904 on the micro-chip 902 and package 906, reflowing (913) to bond the chip 904 to the micro-chip 902 and package 906, and forming (914) an underfill (950) between the chip 904 and package 906.

As illustrated in FIG. 9B, the exemplary method 920 may include joining (e.g., bonding) (921) the micro-chip 902 to a chip 904 (e.g., chip or wafer), forming (922) an underfill 940 between the micro-chip 902 and the chip 904 and forming bumps 907 on the chip 904 and dicing the chip 904 (e.g., dicing the chip 904 into chip 1 and chip 2).

The exemplary method 920 further includes placing (923) the "chip with a micro-chip" (e.g., "flipping" the chip 904) onto the package 906 (e.g., SCM or MCM, although an SCM is depicted in FIG. 9B) and reflowing to bond the chip 904 to the package 906. The method 920 also includes forming (924) an underfill 950 between the chip 904 and the package 906.

As illustrated in FIG. 9C, the exemplary method 930 may include joining (e.g., bonding) (931) the micro-chip 902 to a chip 904 (e.g., chip or wafer). This joining 931 may be repeatedly performed to produce plural "chips with microchips" which may be bonded together to form a "chip stack". The method 930 also includes forming (932) an underfill 940 between the micro-chip 902 and the chip 904 and forming bumps 907 on the chip 904 in the chip stack, and may include dicing the chip 904, or dicing the chip stack (e.g., dicing the chip stack between chips 1, 3 and 5 on one side, and chips 2, 4 and 6 on the other side to form two chip stacks).

The exemplary method 930 further includes placing (933) the chip stack including plural "chips with a micro-chips" (e.g., "flipping" the chip stack) onto the package 906 (e.g., SCM or MCM, although an MCM is depicted in FIG. 9C) and reflowing to bond the chip stack to the package 906. The method 920 also includes forming (934) an underfill 950 between the chip stack and the package 906.

Although each process flow (910, 920, 930) shows one example of how a semiconductor device including a micro-chip device 902 may be fabricated, there are many alternative process flows which could also be considered to achieve the same end structures and are also part of this invention.

An exemplary embodiment of the present invention may rely upon "known good die" testing. In particular, active or passive circuits may be pre-tested and labeled as a "known good die" (KGD) and, thereafter used as a testing platform. For example, small, thinned semiconductor devices may be pre-tested and labeled as a "known good die" if the devices pass the test, and then applied to semiconductor chips and/or chip stacks. In this manner, the While the above-description exemplary devices were described as using a "silicon" carrier those of ordinary skill in the art understand that the carrier may be an organic package, a ceramic package and/or a silicon-based package and still form part of the invention. In particular, the term "through silicon via" should not be limited necessarily to a via formed through silicon, but may include a via formed through other materials (e.g., organic material, ceramic material, semiconductor material, etc.)

Silicon packages provide significant wiring capability because they generally include wiring on a ¼ micron on ½ pitch. In contrast, an organic package may only have wiring with 20 micron line widths on a 40 micron pitch. If two chips need to be connected on an organic package, the organic package limits the amount of connections to no closer to each other than about ten millimeters. Commonly, chips are of the size of about ten millimeters on a side. In that distance, only a couple of hundred of connections can be provided between the chips and an organic package. Thus, a silicon-based package having a one micron pitch may allow a twenty to one hundred times more connections than with an organic package. An exemplary embodiment of the present invention provides a small, thinned semiconductor device between the chips and the organic carrier. In this manner, the small, thinned semiconductor devices may significantly improve the bandwidth of the connection between the chips. Such a small, thinned semiconductor device only needs to have wiring to provide such an advantage.

An exemplary method for bonding these devices may include a tin-copper method. For example, a tin-copper material may be positioned between the larger chip and the small, thinned semiconductor device. An elevated temperature and pressure may be applied to quickly bond the small, thinned semiconductor device to the larger chip. This bond may be formed at a temperature of about 200 degrees Celsius. However, the reaction between the copper and the tin and the pads that are being joined may result in an inter-metallic compound bond that is stable to over 400 degrees Celsius.

Thus, as illustrated in FIGS. 8 and 9, an exemplary aspect of the present invention includes a three-dimensional integrated circuit which includes a semiconductor chip, and a micro-chip which is electrically connected to the chip, and includes a thickness which is less than a thickness of the chip. The semiconductor chip may include plural semiconductor chips formed as a chip stack, in which case the circuit may further include a carrier bonded to the chip stack, the micro-chip forming the three-dimensional integrated circuit with the chip stack and the carrier.

In addition, as illustrated in FIG. 9, another exemplary aspect of the present invention includes a method of fabricating the three dimensional integrated circuit. The method may include, for example, testing and assembly for integrating the circuit integrated into a module or package (e.g., assembling and/or bonding the module or package to the micro-chip and/or the semiconductor chip).

Further, as illustrated in FIG. 9, another exemplary aspect of the present invention includes a structure which includes a micro-chip and may be used for three dimensional circuit integration in die stacks and/or module (e.g., packaging).

It is important to point out that the term "circuit" herein may include an optical elements and/or electrical elements. Thus, for example, the integrated circuit herein may include optical elements (e.g., laser diodes, optical waveguides, etc.) and/or electrical elements (e.g., resistors, diodes, transistors, etc.) formed on other features of the device (e.g., the micro-chip, the semiconductor chip, etc.).

It is also important to note that the micro-chip in the present invention may be not only electrically and/or optically integrated into the device and package, but may also be thermally integrated into the structure. For example, referring again to FIG. 1, the interconnections 108 may include a thermally conductive material (e.g., aluminum, copper, alloys of aluminum or copper, etc.) which may allow for efficient thermal spreading between the micro-chip and other elements of the device (e.g., semiconductor chip, module, etc.). In addition, the micro-chip may also be thermally integrated into the device by adding thermal interconnections (e.g., similar to the interconnections 108), and/or by forming a thermally conductive adhesive between the micro-chip and the semiconductor chip and/or package (e.g., such adhesive may be used as the underfill 950 in FIG. 9C).

While the present invention been described in terms of several exemplary embodiments, those skilled in the art will recognize that the invention can be practiced with modification.

It should be noted that the term "chip" or "semiconductor chip" used herein may be construed to include a "wafer" or "semiconductor wafer" which may be used to produce a chip. Thus, although the present invention may be described herein as including a micro-chip which is electrically connected to a "chip", it should be understood that this would include a micro-chip which is electrically connected to a "wafer". Likewise, the term "chip-stack" (e.g., as depicted in FIG. 9C) may be used to describe a stack of wafers or "wafer stack", and so forth.

Further, it is noted that, Applicant's intent is to encompass equivalents of all claim elements, even if amended later during prosecution.

What is claimed is:

1. A method of fabricating a semiconductor device, said method comprising:
    forming a micro-chip comprising a thinned-wafer having one or more components fabricated thereon disposed between a carrier and a semiconductor chip;
    connecting said semiconductor chip to said carrier, said micro-chip being electrically connected to said semiconductor chip under a higher consumption macro of the semiconductor chip and including a thickness which is less than a thickness of said semiconductor chip;
    forming an interconnect between said semiconductor chip and said carrier for electrically connecting and bonding said semiconductor chip to said carrier;
    forming an interconnect between said micro-chip and said semiconductor chip for electrically connecting and bonding said micro-chip and said semiconductor chip; and
    forming an interconnect between said micro-chip and said carrier for electrically connecting and bonding said micro-chip and said carrier,
    wherein said micro-chip comprises a thinned micro-chip having a thickness of less than 20 microns.

2. The method of claim 1, wherein said micro-chip comprises one of a memory device, a decoupling capacitor, a sensor, and an actuator.

3. The method of claim 1, wherein said connecting said semiconductor chip comprises connecting said semiconductor chip to a first side of said carrier, said method further comprising:
    forming a plurality of interconnects on a second side of said carrier which is opposite said first side.

4. The method of claim 1, wherein said micro-chip comprises a vertical through section (VTS).

5. The method of claim 4, wherein said micro-chip includes a first side and a second side which opposes said first side, said vertical through section (VTS) extending from said first side to said second side.

6. The method of claim 4, further comprising:
    an electrical conductor disposed in said vertical through section (VTS),
    wherein said micro-chip is bonded to said carrier such that said electrical conductor in said vertical through section (VTS) electrically connects said micro-chip to said carrier.

7. The method of claim 1, wherein said micro-chip comprises a through silicon via.

8. The method of claim 1, wherein said semiconductor chip comprises plural semiconductor chips formed as a chip stack, and
    wherein said micro-chip comprises a plurality of micro-chips formed on said plural semiconductor chips, such that said semiconductor device comprises a three-dimensional integrated circuit.

9. The method of claim 8, wherein said carrier is bonded to said chip stack, said plural micro-chips forming said three-dimensional integrated circuit with said chip stack and said carrier.

10. The method of claim 8, further comprising:
    forming plural first elements comprising at least one of optical elements and electrical elements on said micro-chip;
    forming plural second elements comprising at least one of optical elements and electrical elements on said semiconductor chip; and
    integrating said plural first elements together with said plural second elements.

11. The method of claim 10, wherein said micro-chip is thermally integrated together with said semiconductor chip and said carrier.

12. The method of claim 10, further comprising:
    forming plural interconnections for thermally integrating said micro-chip together with said semiconductor chip and said carrier.

13. The method of claim 10, further comprising:
    forming a thermally conductive adhesive between said micro-chip and at least one of said semiconductor chip and said carrier, for thermally integrating said micro-chip together with said semiconductor chip and said carrier.

14. A method of fabricating a semiconductor device, said method comprising:
    forming a micro-chip comprising a thinned-wafer having one or more components fabricated thereon, the micro-chip having a thickness of less than 20 microns on a first side of a package;
    connecting a semiconductor chip to said first side of said package, such that said microchip is disposed between said semiconductor chip and said package and formed under a higher consumption macro of the semiconductor chip; and
    electrically connecting said micro-chip to said semiconductor chip.

15. A method of fabricating a semiconductor device, said method comprising:
    forming a micro-chip chip comprising a thinned-wafer having one or more components fabricated thereon, the micro-chip having a thickness of less than 20 microns on a first side of a semiconductor chip formed under a higher consumption macro of the semiconductor chip;
    electrically connecting said micro-chip to said semiconductor chip; and
    connecting said first side of said semiconductor chip to a package, such that said microchip is disposed between said semiconductor chip and said package.

16. The method of claim 1, said forming the micro-chip comprising:
    forming a via in the thinned-wafer;
    forming an insulating layer in the via; and
    filling the via with a metal fill.

* * * * *